United States Patent
Dowd et al.

Patent Number: 5,123,024
Date of Patent: Jun. 16, 1992

[54] APPARATUS AND METHOD FOR CONTROLLING THE LIGHT INTENSITY OF A LASER DIODE

[75] Inventors: Roger D. Dowd, Watertown; Peter T. Flowers, Dorchester, both of Mass.

[73] Assignee: General Scanning, Inc., Watertown, Mass.

[21] Appl. No.: 741,087

[22] Filed: Aug. 6, 1991

[51] Int. Cl.[5] ............................................... H01S 3/14
[52] U.S. Cl. ........................................ 372/38; 372/31
[58] Field of Search ................................ 372/31, 38

[56] References Cited

U.S. PATENT DOCUMENTS

| | | | |
|---|---|---|---|
| 4,625,315 | 11/1986 | Lemberger et al. | 372/38 |
| 4,709,369 | 11/1987 | Howard | 372/38 |
| 4,733,398 | 3/1988 | Shibagaki et al. | 372/31 |
| 4,768,198 | 8/1988 | Deki | 372/31 |
| 4,837,787 | 6/1989 | Takesue et al. | 372/31 |
| 4,887,271 | 12/1989 | Taylor | 372/31 |
| 4,916,706 | 4/1990 | Ohashi | 372/38 |
| 4,945,541 | 7/1990 | Nakayama | 372/31 |
| 4,949,345 | 8/1990 | Luijtjes | 372/31 |
| 5,019,769 | 5/1991 | Levinson | 372/31 |
| 5,050,177 | 9/1991 | Ema | 372/31 |

OTHER PUBLICATIONS

"Laser Diode User's Manual", Sharp Corporation, Sep. 1988, pp. 31-32.

*Primary Examiner*—John D. Lee
*Assistant Examiner*—Robert E. Wise
*Attorney, Agent, or Firm*—Cesari and McKenna

[57] ABSTRACT

A closed loop circuit for controlling the intensity of light emitted by a laser diode. A portion of the light emitted by the laser diode is used as an optical feedback signal and applied to a photodetector. The difference between a current produced by the photodetector and a reference current is an error current which is passed via a low impedance path to an integrating amplifier. The integrated error current is used to control the current flowing through the laser diode, thereby controlling the intensity of light emitted.

19 Claims, 2 Drawing Sheets

APPARATUS AND METHOD FOR CONTROLLING THE LIGHT INTENSITY OF A LASER DIODE

BACKGROUND OF THE INVENTION

1. Field of the Invention

This invention relates generally to the field of laser diodes and, more particularly, to circuitry for delivering a light beam of controllable intensity from a laser diode.

2. Discussion of the Prior Art

A laser diode is a device which emits coherent light whose intensity is approximately proportional to the current flowing through the diode over a 20:1 dynamic range. A laser diode's light intensity may be effectively modulated by time-varying the current through the diode. Such modulation is useful in various applications including, for example, imaging systems where a laser diode is used as a light source for the pixel-by-pixel recording of continuous tone images.

A laser diode's operating characteristics are temperature-dependent and may vary widely in response to changes in the ambient temperature or self-heating. Such temperature changes may cause significant changes in the intensity of emitted light even though the current through the diode is constant.

A servo loop circuit may be used to control and stabilize the light emitted by a laser diode. A portion of the light emitted by the diode is used as a feedback signal and applied to a photodetector. The magnitude of a signal produced by the photodetector is related (i.e., proportional) to the intensity of the light emitted by the laser diode. By comparing the signal produced by the photodetector with an input signal (reference), a difference or error signal is obtained which may be used to adjust the current flowing through the laser diode and, in turn, the intensity of light emitted.

One problem which arises with such feedback circuits is that the loop gain decreases when the current flowing through the laser diode is relatively small (i.e., low light intensity), because the laser diode is operating in a non-linear region. In this region, relatively large changes in the magnitude of the current through the laser diode produce only small changes in the intensity of light emitted by the laser diode (and thus small changes in the feedback signal). Consequently, it is desirable to integrate the error signal to force the error to zero, which has the effect of trading off loop gain for bandwidth.

However, conventional integrating feedback circuits may not provide sufficient bandwidth for applications in which the input signal varies rapidly over a wide dynamic range. One such application, referenced above, is continuous tone imaging, which typically requires extremely rapid modulation of the light emitted by the laser diode over a large dynamic range.

An additional problem arises when a photodiode (typically a PIN diode is chosen) is used as the photodetector in the feedback loop. Because of the diode junction capacitance the voltage drop across the photodiode is a function of frequency, significant error may be introduced into the loop where that voltage drop is used as a feedback signal and there is significant variation in frequency.

In one prior arrangement, the current from the diode passes through a resistor and the resulting voltage across the resistor is applied to a unity gain amplifier. The output of this amplifier is the feedback signal for the servo loop.

The output of the unity gain amplifier is also fed back to the photodiode, ideally to maintain a constant zero (AC) voltage across the photodiode (in order to cancel the effects of the photodiode's junction capacitance). However, the amplifier has a finite gain bandwidth product, which means that at higher frequencies a non-zero voltage will appear across the photodiode and error will be introduced into the system. In addition, at high frequencies the unity gain amplifier requires a high input current and is generally noisy.

SUMMARY OF THE INVENTION

In brief summary, the present invention provides a closed loop circuit or servo for controlling the intensity of light emitted by a laser diode which is modulated by an analog input signal. The invention provides substantially improved bandwidth when operating the laser diode at low light levels. In an exemplary embodiment, the servo loop provides a −3 db bandwidth of approximately 50 MHz over a 20:1 dynamic range.

The servo continuously adjusts the current flow through the laser diode, thus adjusting the intensity emitted light to correspond with the input signal. A portion of the light emitted by the laser diode is used as a feedback signal and applied to a photodetector, which produces a current that is proportional to the intensity of the impinging light. The difference between the input signal current and the current produced by the photodetector is an error signal (current) that is integrated by a transimpedance amplifier, which produces a voltage control signal at its output. The control signal is buffered and applied to a wide-band transconductance amplifier which controls the current flowing through the laser diode.

The transimpedance amplifier preferably includes an operational amplifier, a single-stage discrete amplifier driven by the operational amplifier and a parallel combination resistor and capacitor which provide a load impedance for the discrete amplifier. These elements cooperate to perform the integration function over a wide frequency range of error signals. At lower frequencies, the operational amplifier, in combination with a feedback capacitor coupled between its output and inverting input, integrates the error current. The integrated error current is converted to a voltage by the load impedance of the discrete amplifier.

At higher frequencies, the feedback capacitor coupled to the operational amplifier appears as a short circuit that effectively bypasses the operational amplifier and applies the error current directly to the emitter of the discrete amplifier. The discrete amplifier thus operates in a common base configuration, which is characterized by a low input impedance, a high output impedance and a current gain close to unity. The high frequency components of the error signal are thus effectively integrated by the load capacitor.

By using the current generated by the photodetector, as opposed to the voltage drop across the photodetector, as a feedback signal, error due to frequency-dependent changes in the voltage drop is substantially eliminated.

In addition, since the error signal (current) is integrated over a broad frequency band, the laser diode characteristics are effectively linearized over that band, thus providing more precise control of the laser diode's light intensity even at high input signal frequencies.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
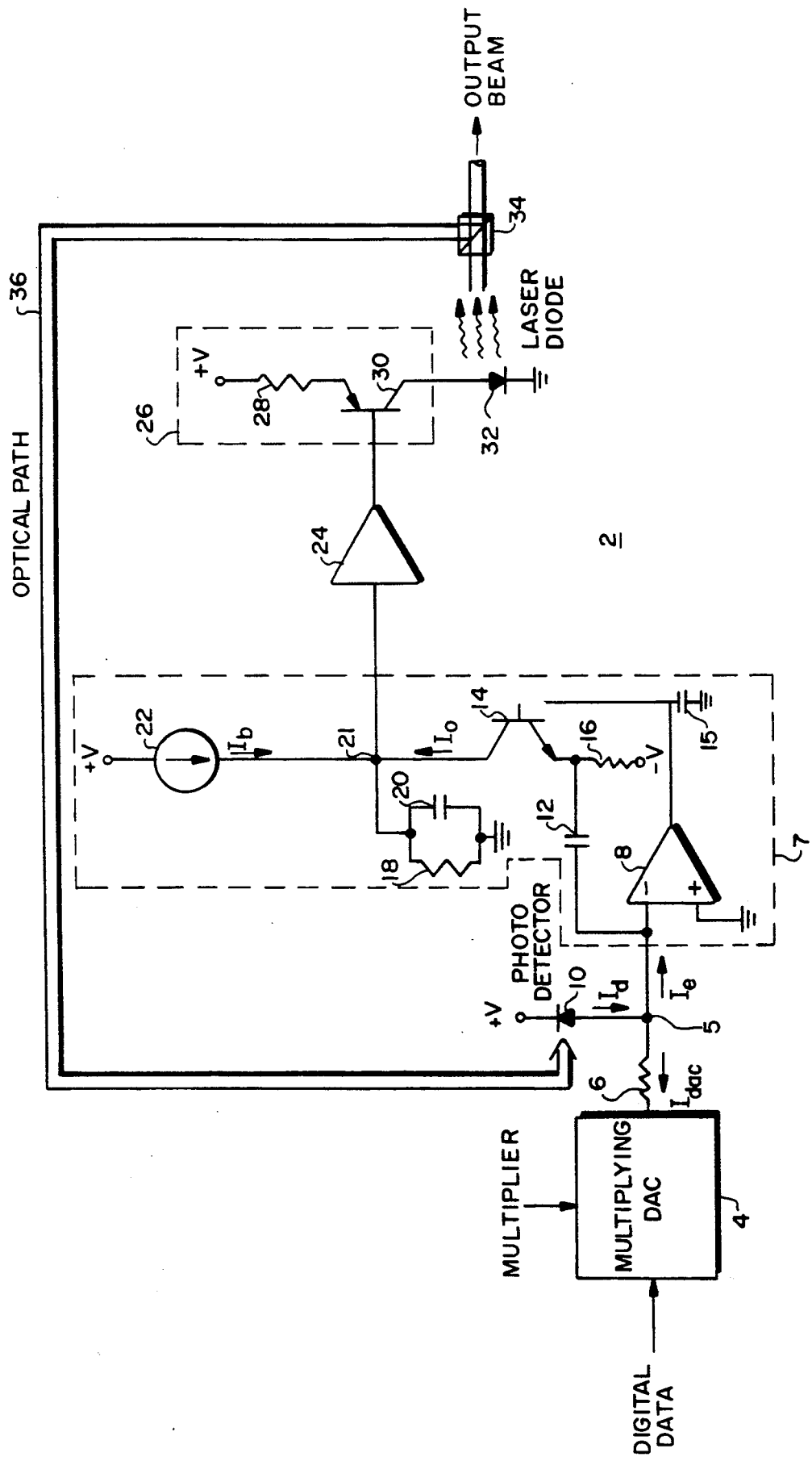
FIG. 1 is a diagram of a circuit for controlling the intensity of light emitted by a laser diode constructed in accordance with a preferred embodiment of the present invention.

FIG. 1 shows a closed loop circuit or servo 2 for controlling the intensity of light emitted by a laser diode which is modulated by an analog input signal. A multiplying digital to analog converter (DAC) 4 is connected to receive digital data and a multiplier value as input signals. The resulting analog output of the DAC 4 is connected via a resistor 6 to the anode of a photodetector or photodiode 10 and to the inverting input of an operational amplifier 8. The cathode of the photodiode 10 is connected to a source of potential $+V$, which serves to reverse bias the photodiode. The non-inverting input of the amplifier 8 is grounded. A capacitor 15 is connected between ground and the output of the amplifier 8, which is also connected to the base of a transistor 14. A feedback capacitor 12 is connected between the emitter of transistor 14 and the inverting input of amplifier 8. A resistor 16 is connected between the emitter of transistor 14 and a source of potential $-V$.

A load impedance comprising the parallel combination of a resistor 18 and a capacitor 20 is connected between ground and a node 21 at the collector of transistor 14 A constant current source 22, which supplies a current $I_b$, is connected between the potential source $+V$ and the node 21. An input of a buffer amplifier 24 is also connected to the node 21.

For convenience and clarity, the resistance or capacitance of a component will be expressed as "R" or "C," respectively, having a subscript which corresponds with the reference numeral of the component. As explained in detail below, the product $R_{18}C_{20}$ is preferably equal to the product $R_{16}C_{12}$.

The components within the dashed line denoted by the reference numeral 7 are referred to collectively hereafter as a transimpedance integrating amplifier 7.

The output of buffer amplifier 24 is connected to the base of a transistor 30. A resistor 28 is connected between the emitter of the transistor 30 and the potential source $+V$. The resistor 28 and transistor 30 operate collectively as a transconductance amplifier 26.

The anode of a laser diode 32 is connected to the collector of the transistor 30 and the cathode of diode 32 is grounded. Light emitted by the laser diode 32 passes through a beam splitter 34. A portion of the light passing through the beam splitter 34 passes along an optical path 36 and impinges on the photodiode 10. The bulk of the light entering the beam splitter 34 passes through the beam splitter as an output beam.

Transistors 14 and 30 are preferably of the type which are designed to operate over a frequency range extending to 1-2 GHz, such transistors being commercially available from a number of sources. Buffer amplifier 24 is preferably implemented as a cascaded pair of emitter follower amplifiers using transistors similar to transistors 14 and 30.

Figure 2:
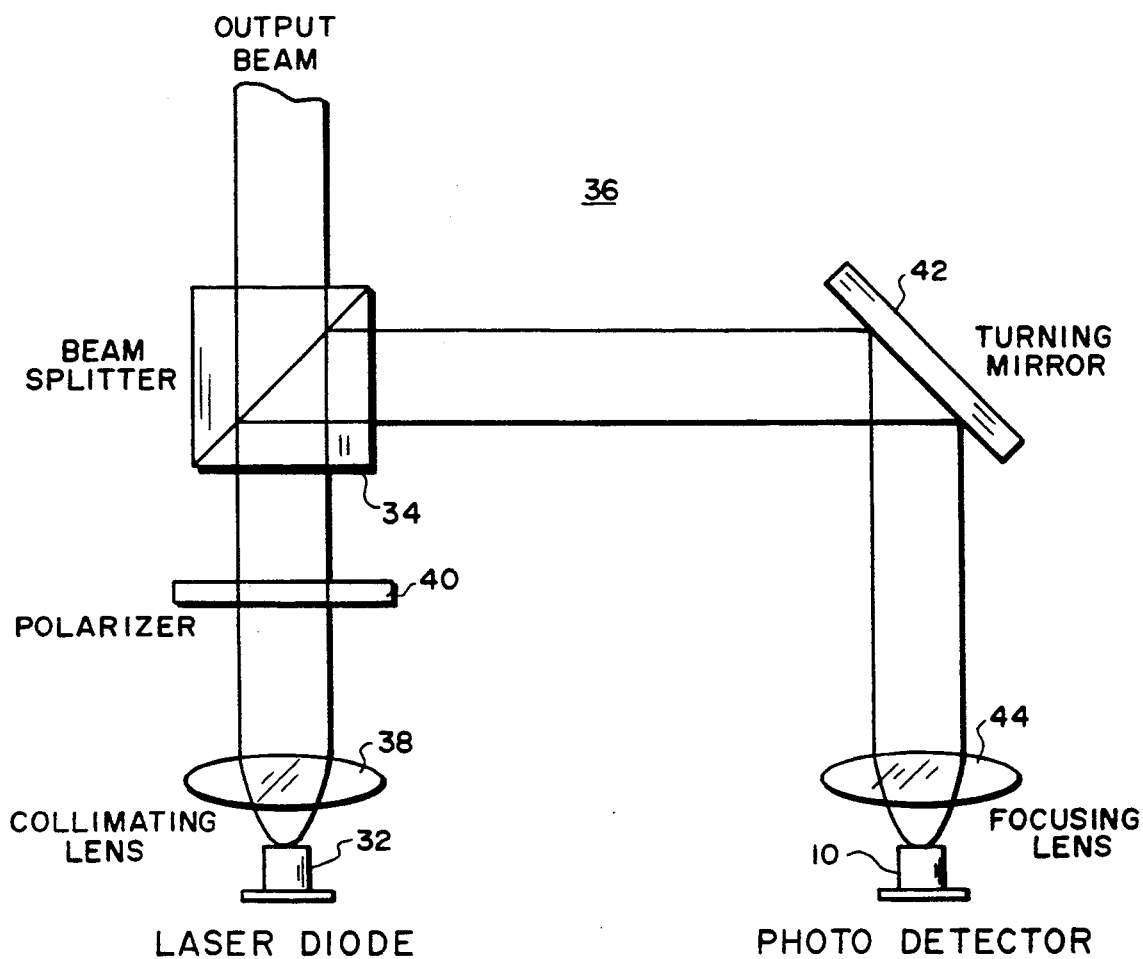
FIG. 2 is a detailed diagram of the optical path shown in FIG. 1.

As shown in greater detail in FIG. 2, the optical path 36 includes a series of optical elements. A collimating lens 38 is positioned to receive light emitted by the laser diode 32. Light passing through the lens 38 is directed through a polarizer 40. The polarized light is then directed to the beam splitter 34. Preferably, approximately 20% of the light entering the splitter 34 is directed to a turning mirror 42 and then through a focusing lens 44 to the photodiode 10. The turning mirror 42 permits the placement of the photodiode 10 on the same mounting surface as the laser diode 32 and minimizes the distance between the diodes.

It should be noted that the polarizer 40 operates to linearize the optical feedback signal carried along the optical path 36. In the absence of the polarizer 40, the relative percentages of light passing outward from the beam splitter 34 would vary at low light levels, thereby introducing error into the system.

The optical feedback signal passed along the path 36 is indicative of the intensity of light emitted by the laser diode 32. Preferably, the length of the optical path 36 is limited to avoid introduction of excessive phase delay into the feedback loop The detailed operation of the circuit shown in FIG. will now be described. The multiplying DAC 4 produces a current $I_{dac}$ at its output which represents the product of the received digital data and the multiplier value. The digital data and multiplier value may originate from a conventional source such as a microprocessor or memory (not shown). The digital data may, for example, represent information for forming an image on photographic film or other medium, while the multiplier value may represent a correction factor for compensating for differences in scanning speeds of a scanner (not shown) that sweeps the laser output beam over the image medium.

As the optical feedback signal passed along path 36 impinges on the photodiode 10, a current $I_d$ is produced by the photodiode. The current $I_d$ is proportional to the intensity of the impinging feedback signal. Since the currents entering and leaving the node 5 must equal, the difference (if any) between $I_{dac}$ and $I_d$ is $I_e$, an error current. That is, the magnitude of $I_e$ represents the difference between the actual intensity of light emitted by the laser diode 32 and the "correct" intensity represented by $I_d$. The servo 2 operates to control the laser diode's output so as to maintain $I_e$ essentially at zero.

More specifically, at low frequencies, the transistor 14 operates as a transconductance amplifier of the output of the amplifier 8. The signal component of its collector current passes through the resistor 18 and is thus converted to a control voltage proportional to the resistance $R_{18}$, the capacitor 20 having little effect at these frequencies. The transistor 14 also operates as an emitter-follower amplifier in the feedback path of the amplifier 8, applying the output of the latter amplifier to the capacitor 12. The capacitor 12, in turn, provides the desired integration of the error signal $I_e$ and produces a control voltage which is applied to the buffer amplifier 24.

Also, the negative feedback around the amplifier 8 forces the voltage at the inverting input terminal to zero. This provides zero impedance for the current $I_d$ from the photodiode 10. With the low impedance, the photodiode 10 operates as a current source, essentially eliminating the effect of its junction capacitance and thereby extending the frequency range of the photodiode.

The control voltage is buffered by the buffer amplifier 24, which is preferably unity gain, and applied to the transconductance amplifier 26 (the base of transistor 30). The current flowing through the collector of the transistor 30, which is the same as that flowing through the laser diode 32 is effectively controlled by the voltage applied to the base of transistor 30.

At high frequencies, the gain of the amplifier 8 diminishes and the capacitor 15 presents a very low impedance. The amplifier 8 thus has no substantial effect on circuit operations. However, the impedance of the capacitor 12 is low, thus providing a low impedance path through this capacitor, the base-emitter junction of the transistor 14 and the capacitor 15. Again this provides the desired current-source operation of the photo-diode 10. Moreover, with this current path, the transistor 14 operates as a common-base amplifier at these frequencies. The output of this amplifier stage passes predominantly through the capacitor 20, which serves as an integrator of the error signal, since the voltage across a capacitor is the integral of the current through it.

The crossover frequency for these modes of operation corresponds to the time constant $R_{16}C_{12}$ in the case of the amplifier 8 and the time constant $R_{18}C_{20}$ for the output of the transistor 14. These time constants are, therefore, preferably equal and on the order of 50-100 kHz. In this fashion, the integrating amplifier 7 is able to produce an integrated error signal for a wide input frequency range, thus substantially increasing the operating bandwidth of the system.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed is:

1. An apparatus for delivering a light beam of controllable intensity from a laser diode, said apparatus comprising;
    a laser diode;
    current control means coupled to the laser diode and responsive to a control signal for modulating the magnitude of a current flowing through said laser diode;
    optical feedback means coupled to the laser diode to a photodetecting means, said photodetecting means for producing a first current whose magnitude is related to the intensity of the light received from the feedback means;
    integrating amplifier means having a low impedance input path for receiving an error current which is the difference between the first current and a time-varying reference current and producing an output signal which is the integral of the error current; and
    conversion means for receiving the output signal of the integrating amplifier means and converting it to the control signal for application to the current control means.

2. The apparatus as in claim 1 wherein said current control means comprises a transconductance amplifier.

3. The apparatus as in claim 1 wherein said optical feedback means comprises a collimating lens, a polarizer, a beam splitter, a turning mirror and a focusing lens arranged such that light emitted from the laser diode passes through the collimating lens and polarizer before entering the beam splitter, and a portion of light extracted by the beam splitter is reflected by the turning mirror through the focusing lens to the photodetecting means.

4. The apparatus as in claim 1 wherein said photodetecting means comprises a PIN diode.

5. The apparatus as in claim 1 wherein said time-varying reference current is generated by a digital to analog converter.

6. The apparatus as in claim 1 wherein said integrating amplifier means comprises a transimpedance amplifier.

7. The apparatus as in claim 1 wherein said integrating amplifier means comprises a first amplifier coupled to a second amplifier, whereby for frequencies below a predetermined frequency the first amplifier integrates the error current and for frequencies above the predetermined frequency the second amplifier passes the error current to an integrating means.

8. The apparatus as in claim 7 wherein the first amplifier comprises an integrating operational amplifier.

9. The apparatus as in claim 7 wherein the second amplifier operates as a transconductance amplifier for frequencies below the predetermined frequency and as a unity gain current amplifier for frequencies above the predetermined frequency.

10. The apparatus as in claim 1 wherein said conversion means comprises a parallel resistance and capacitance connected to convert the integrated error current to a voltage.

11. A method for delivering a light beam of controllable intensity from a laser diode, said method comprising the steps of:
    extracting a portion of the light emitted by a laser diode for use as an optical feedback signal;
    applying the optical feedback signal to a photodetector for generating a first current whose magnitude is related to the intensity of the applied light;
    producing an error current which is the difference between the first current and a time-varying reference current;
    applying the error current to an integrating amplifier having a low input impedance path to produce an integrated error signal; and
    converting the integrated error signal to a control signal for modulating the magnitude of a current flowing through the laser diode, thereby adjusting the intensity of light emitted by the laser diode.

12. The method as in claim 11 wherein the control signal is applied to a transconductance amplifier which is used to adjust the magnitude of the current flowing through the laser diode.

13. The method as in claim 11 wherein the light emitted by the laser diode passes through a collimating lens and a polarizer before entering a beam splitter which extracts the portion of light used for the optical feedback signal.

14. The method as in claim 11 wherein the optical feedback signal is applied to a PIN diode.

15. The method as in claim 11 wherein the time-varying reference current is generated by a digital to analog converter.

16. The method as in claim 11 wherein the error current is applied to an integrating transimpedance amplifier.

17. The method as in claim 11 wherein the integrating amplifier comprises a first amplifier coupled to a second amplifier, whereby for frequencies below a predetermined frequency the first amplifier integrates the error current and for frequencies above the predetermined frequency the second amplifier passes the error current to an integrating means.

18. The method as in claim 17 wherein the first amplifier comprises an integrating operational amplifier.

19. The method as in claim 17 wherein the second amplifier operates as a transconductance amplifier for frequencies below the predetermined frequency and as a unity gain current amplifier for frequencies above the predetermined frequency.

* * * * *